(12) United States Patent
Agrawal et al.

(10) Patent No.: US 8,722,447 B2
(45) Date of Patent: May 13, 2014

(54) SELENIZATION OF PRECURSOR LAYER CONTAINING $CuInS_2$ NANOPARTICLES

(75) Inventors: Rakesh Agrawal, West Lafayette, IN (US); Hugh Hillhouse, Seattle, WA (US); Qijie Guo, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 13/145,016

(22) PCT Filed: Jan. 21, 2010

(86) PCT No.: PCT/US2010/021636
§ 371 (c)(1),
(2), (4) Date: Oct. 20, 2011

(87) PCT Pub. No.: WO2010/085553
PCT Pub. Date: Jul. 29, 2010

(65) Prior Publication Data
US 2012/0122268 A1    May 17, 2012

Related U.S. Application Data

(60) Provisional application No. 61/146,084, filed on Jan. 21, 2009.

(51) Int. Cl.
*H01L 21/00* (2006.01)
*H01L 31/00* (2006.01)

(52) U.S. Cl.
USPC ............. 438/57; 438/85; 438/95; 257/428; 136/264; 136/265

(58) Field of Classification Search
None
See application file for complete search history.

(56) References Cited

U.S. PATENT DOCUMENTS

| | | | |
|---|---|---|---|
| 5,858,121 A | 1/1999 | Wada et al. | |
| 5,985,691 A | 11/1999 | Basol et al. | |
| 6,127,202 A | 10/2000 | Kapur et al. | |
| 6,566,162 B2 | 5/2003 | Yamada et al. | |
| 7,306,823 B2 | 12/2007 | Sager et al. | |
| 7,955,586 B2 * | 6/2011 | Jung et al. | 423/508 |

(Continued)

FOREIGN PATENT DOCUMENTS

| | | |
|---|---|---|
| EP | 0763859 A2 | 3/1997 |
| JP | 2002/329877 | 11/2002 |

(Continued)

OTHER PUBLICATIONS

Pisarkiewicz et al., Vacuum selenization of metallic multilayers for CIS solar cells, Vacuum, vol. 70, Issues 2-3, Mar. 10, 2003, pp. 435-438.*

(Continued)

*Primary Examiner* — Andres Munoz
(74) *Attorney, Agent, or Firm* — Brinks Gilson & Lione

(57) ABSTRACT

A method of fabrication of thin films for photovoltaic or electronic applications is provided. The method includes fabricating a nanocrystal precursor layer and selenizing the nanocrystal precursor layer in a selenium containing atmosphere. The nanocrystal precursor layer includes one of $CuInS_2$, $CuIn(S_y,Se_{1-y})_2$, $CuGaS_2$, $CuGa(S_y, Se_{1-y})_2$, $Cu(In_xGa_{1-x})S_2$, and $Cu(In_xGa_{1-x})(S_y, Se_{1-y})_2$ nanoparticles and combinations thereof, wherein $0 \leq x \leq 1$ and $0 \leq y \leq 1$.

4 Claims, 6 Drawing Sheets

(56) References Cited

U.S. PATENT DOCUMENTS

| | | |
|---|---|---|
| 2002/0106873 A1 | 8/2002 | Beck et al. |
| 2003/0106488 A1 | 6/2003 | Huang et al. |
| 2005/0183768 A1 | 8/2005 | Roscheisen et al. |
| 2006/0207644 A1* | 9/2006 | Robinson et al. ............. 136/243 |
| 2007/0092648 A1 | 4/2007 | Duren et al. |
| 2007/0163637 A1 | 7/2007 | Robinson et al. |
| 2007/0163639 A1* | 7/2007 | Robinson et al. ............. 136/262 |
| 2007/0163644 A1 | 7/2007 | Van Duren et al. |
| 2007/0283998 A1 | 12/2007 | Kuriyagawa et al. |
| 2008/0044570 A1 | 2/2008 | Meyer et al. |
| 2008/0142072 A1 | 6/2008 | Yu et al. |
| 2008/0257201 A1* | 10/2008 | Harris et al. ................. 106/1.18 |
| 2009/0260670 A1* | 10/2009 | Li ................................ 136/244 |
| 2010/0291758 A1 | 11/2010 | Robinson et al. |

FOREIGN PATENT DOCUMENTS

| | | |
|---|---|---|
| JP | 2009/33071 | 2/2009 |
| WO | WO 2006/070800 A1 | 7/2006 |
| WO | WO 2006/101986 | 9/2006 |
| WO | WO 2007/134843 | 11/2007 |
| WO | WO 2008/021604 A2 | 2/2008 |
| WO | WO 2008/057119 A1 | 5/2008 |
| WO | WO 2009064056 A1 * | 5/2009 ............... B82B 3/00 |
| WO | WO 2009/068878 | 6/2009 |

OTHER PUBLICATIONS

Tuttle, et al., "Structure, chemistry, and growth mechanisms of photovoitaic quality thin-film Cu(In,Ga)Se2, grown from a mixed-phrase precursor", Journal of Applied Physics, vol. 77, No. 1, pp. 153-161, Jan. 1, 1995.

Guillemoles, et al., "One step electrodeposition of CuInSe2: Improved structural, electronic, and photovoltaic properties by annealing under high selenium pressure", Journal of Applied Physics, vol. 79, No. 9, pp. 7293-7302, May 1, 1996.

International Preliminary Report on Patentability, PCT/US2010/021636.

Koetschau et al., Structural Aspects of Band Gap Grading in Gu(In,Ga)(S,Se)2-Based Solar Cells, Jpn, J. Appl. Phys, 39, 418-420, 2000.

* cited by examiner

SELENIZATION OF PRECURSOR LAYER CONTAINING CuInS$_2$ NANOPARTICLES

CROSS-REFERENCE TO RELATED APPLICATIONS

This application is a National Stage application of International Application No. PCT/US2010/021636, filed Jan. 21, 2010, which claims the benefit of U.S. Provisional Application Ser. No. 61/146,084, filed on Jan. 21, 2009, the entire contents of which are incorporated herein by reference.

FIELD OF THE INVENTION

The present invention relates generally to the fabrication of thin films for photovoltaic or electronic applications, and, in particular to the fabrication and selenization of a nanocrystal precursor layer containing nanoparticles of CuInS$_2$ or its related alloys.

BACKGROUND OF THE INVENTION

CuInSe$_2$ thin films have been traditionally fabricated using vacuum co-evaporation. However, the production cost is high, which has limited applicability for large scale fabrication. Methods have been reported for the deposition of precursor layers and subsequent selenization to form active absorber films. However, there are several drawbacks associated with the choices of source materials in precursor layers used for selenization. For example, for metal or metal alloy based precursor layers, a major challenge is delamination of the films after selenization. Another challenging problem is the lack of control on the composition of the film at all scales.

BRIEF SUMMARY OF THE INVENTION

Although methods have been reported on the deposition of precursor layers and subsequent selenization to form active absorber thin films, there is a need in the art for an alternative source material in precursor layers based on particles that can overcome the above-mentioned disadvantages and provide the advantages of a solution-based deposition method. One aspect of the present invention is to achieve this goal.

Examples of the present invention provide a method for the fabrication of the CIS and CIGS absorber thin films by utilizing a precursor layer containing copper indium disulfide (CuInS$_2$) nanoparticles, or its related alloys with Ga and Se, including, for example, Cu(In,Ga)S$_2$ and CuIn(S,Se)$_2$, followed by selenization in an atmosphere containing selenium at elevated temperatures. The composition of the CuInS$_2$ nanoparticles and its alloys may be stoichiometry, copper rich or poor, and indium rich or poor, depending on the composition of the film desired. By forming nanoparticles of CuInS$_2$, or its related alloys, the composition of the films will be fixed at the molecular level, a feature that is not achieved in the prior art. Furthermore, a degree of volume expansion in the film is expected by replacing the sulfur with selenium through the selenization process, leading to densely packed grains. This will help to reduce the porosity in the final absorber thin film, thus leading to more stable optoelectronic and electronic properties suitable for photovoltaic application.

In one example, the present invention provides a method of fabrication of thin films for photovoltaic or electronic applications. The method includes fabricating a nanocrystal precursor layer comprising one of CuInS$_2$, CuIn(S$_y$,Se$_{1-y}$)$_2$, CuGaS$_2$, CuGa(S$_y$, Se$_{1-y}$)$_2$, Cu(In$_x$Ga$_{1-x}$)S$_2$, and Cu(In$_x$Ga$_{1-x}$)(S$_y$, Se$_{1-y}$)$_2$ nanoparticles and combinations thereof, wherein $0 \leq x \leq 1$ and $0 \leq y \leq 1$. The nanocrystal precursor layer is then selenized in a selenium containing atmosphere.

In another example, the present invention provides a method of fabrication of a nanocrystal precursor layer. The method includes coating a substrate with a nanocrystal ink comprising one of CuInS$_2$, CuIn(S$_y$,Se$_{1-y}$)$_2$, CuGaS$_2$, CuGa(S$_y$, Se$_{1-y}$)$_2$, Cu(In$_x$Ga$_{1-x}$)S$_2$, and Cu(In$_x$Ga$_{1-x}$)(S$_y$, Se$_{1-y}$)$_2$ nanoparticles and combinations thereof, wherein $0 \leq x \leq 1$ and $0 \leq y \leq 1$.

In a further aspect, the method of fabrication of a nanocrystal precursor layer includes coating the substrate with a second ink solution, which comprises at least one of: Cu, In, Ga, S, and Se particles, and their alloys; oxide particles of Cu, In, Ga, S, and Se, and combinations thereof; and chalcogenide particles of Cu, In, and Ga, and combinations thereof, wherein the chalcogenide includes compounds of at least one of S, Se, and Te. The second ink solution may or may not contain one of CuInS$_2$, CuIn(S$_y$,Se$_{1-y}$)$_2$, CuGaS$_2$, CuGa(S$_y$, Se$_{1-y}$)$_2$, Cu(In$_x$Ga$_{1-x}$)S$_2$, and Cu(In$_x$Ga$_{1-x}$)(S$_y$, Se$_{1-y}$)$_2$ nanoparticles and combinations thereof, wherein $0 \leq x \leq 1$ and $0 \leq y \leq 1$.

Further objects, features, and advantages of the present invention will become apparent from consideration of the following description and the appended claims when taken in connection with the accompanying drawings.

BRIEF DESCRIPTION OF THE DRAWINGS

Corresponding reference characters indicate corresponding parts throughout the several views.

DETAILED DESCRIPTION OF THE INVENTION

The examples of the present teachings described below are not intended to be exhaustive or to limit the teachings to the precise forms disclosed in the following detailed description. Rather, the embodiments are chosen and described so that others skilled in the art may appreciate and understand the principles and practices of the present teachings.

Embodiments of the present invention provide new methods of fabrication of CuInSe$_2$ (CIS) absorber films and its related alloys, including CuGaSe$_2$, Cu(In$_x$Ga$_{1-x}$)Se$_2$, and Cu(In$_x$Ga$_{1-x}$)(S$_y$, Se$_{1-y}$)$_2$, where $0 \leq x \leq 1$ and $0 \leq y \leq 1$, collectively known as CIGS, by selenization of a nanocrystal precursor layer comprising CuInS$_2$ nanoparticles or its related alloys, for example, $CuInS_2$, $CuIn(S_y,Se_{1-y})_2$, $CuGaS_2$, $CuGa(S_y, Se_{1-y})_2$, $Cu(In_xGa_{1-x})S_2$, and $Cu(In_xGa_{1-x})(S_y, Se_{1-y})_2$. The term "$CuInS_2$ nanoparticles and its related alloys," as used herein, includes nanoparticles of $CuInS_2$, $CuIn(S_y, Se_{1-y})_2$, $CuGaS_2$, $CuGa(S_y, Se_{1-y})_2$, $Cu(In_xGa_{1-x})S_2$, and $Cu(In_xGa_{1-x})(S_y, Se_{1-y})_2$ and combinations thereof, where $0 \leq x \leq 1$ and $0 \leq y \leq 1$.

Nanoparticles are discrete entities sized between about 1 nm and up to about 1000 nm or greater, preferably less than about 100, and more preferably in the neighborhood of about 15 nm. Since smaller particles will lead to a more densely packed nanoparticle film, the nanocrystal precursor layer may be solely comprised of $CuInS_2$ nanoparticles (FIG. 1a), or may be comprised of a mixture of $CuInS_2$ nanoparticles and other particles of the CIGS family of materials (FIGS. 1b-d). FIGS. 1a-d depict various methods of fabrication of absorber thin films in accordance with teachings of the present invention. In each embodiment of FIGS. 1a-d, a nanocrystal precursor layer is fabricated and selenized to form a CIS absorber thin film, and the nanocrystal precursor layer contains nanoparticles of $CuInS_2$ and/or its related alloys.

Figure 1A:
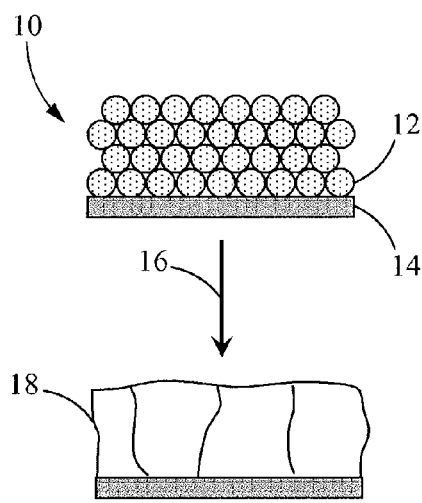
FIGS. 1a-1f are schematic diagrams illustrating methods of fabricating a thin film in accordance with various embodiments of the present invention.
Figure 1B:
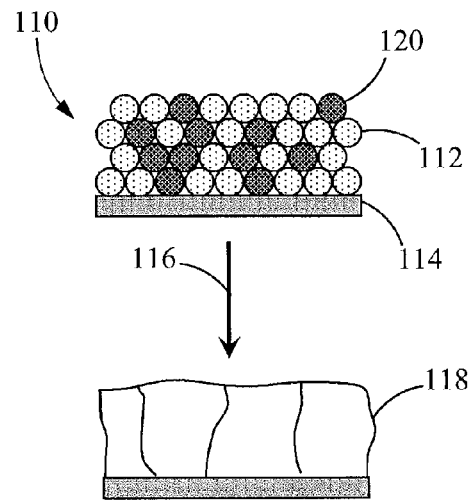
Figure 1C:
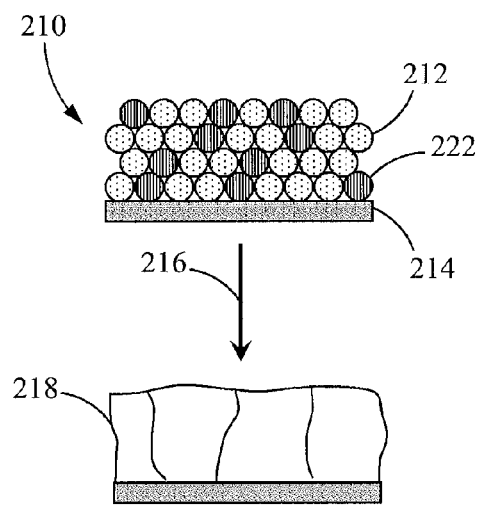
Figure 1D:
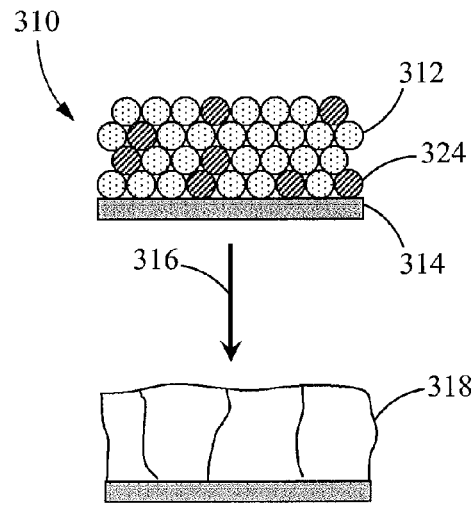
Figure 1E:
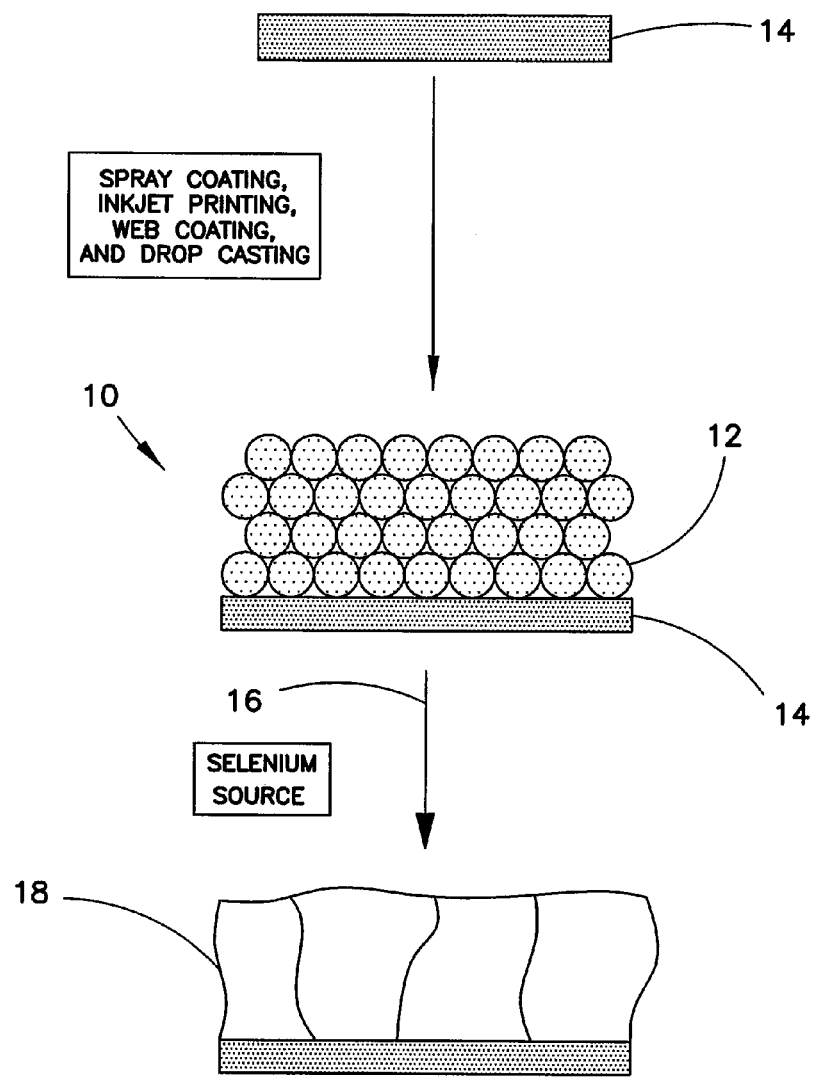
Figure 1F:
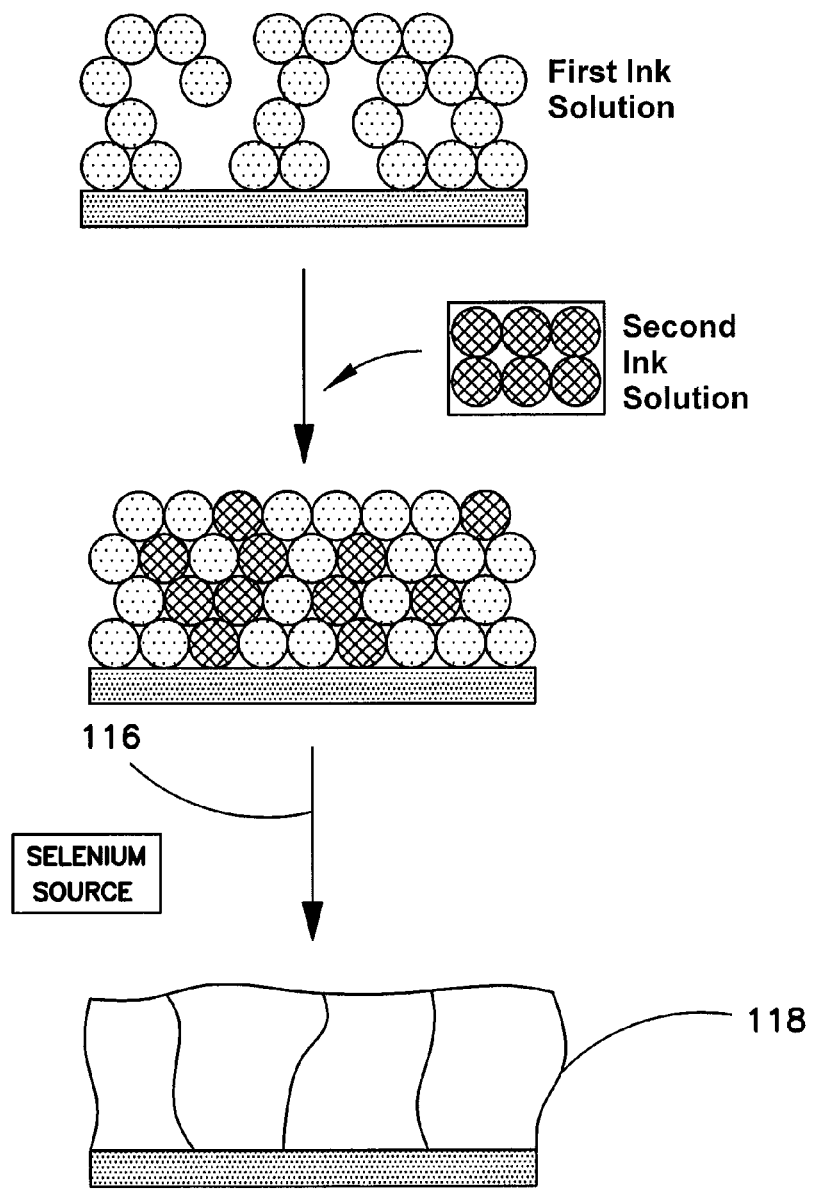

Referring to FIG. 1a, a method of fabrication of an absorber thin film in accordance with the teachings of the present invention is illustrated. The method includes fabricating a nanocrystal precursor layer 10. In this embodiment, the nanocrystal precursor layer 10 contains only $CuInS_2$ nanoparticles 12 deposited onto a substrate 14 of choice. After the formation of the nanocrystal precursor layer 10 containing $CuInS_2$ nanoparticles 12 on the desired substrate 14, a subsequent treatment under a selenium (Se) containing atmosphere at an elevated temperature is used to convert the nanocrystal precursor layer 10 into a CIS absorber thin film 18 in a single or multiple step process. This selenization step is denoted by arrow 16.

Prior to the selenization step 16, the $CuInS_2$ nanocrystal precursor layer 10 may be annealed under various atmospheres, such as inert, reducing, and oxidizing atmospheres, to remove the organic surfactants that may be present in the precursor layer 10. Preferably, the nanocrystal precursor layer 10 is selenized in the Se containing atmosphere at a temperature range from about 350° C. to about 650° C. for a desired amount time to convert the $CuInS_2$ nanoparticles into the CIS absorber thin film 18. In this embodiment, the source of Se in the selenization step 16 may be from $H_2Se$, Se vapor, Se pellets, or organometallic Se precursors, or combinations thereof.

After the selenization 16 of the nanocrystal precursor layer 10, the CIS absorber thin film 18 typically grows densely packed large grains. The resulting CIS thin film 18 has suitable optoelectronic and electronic properties, and may be further processed into a functional photovoltaic device or other non-solar related applications. In this embodiment, in which only $CuInS_2$ nanoparticles 12 were used as the precursor layer 10, the composition of the film 18, particularly the ratio of Cu:In, is fixed within the stoichiometry of the $CuInS_2$ nanoparticles 12.

FIGS. 1b, 1c, and 1d illustrate alternative embodiments of the present invention having a description similar to that in FIG. 1a and in which similar components are denoted by similar reference numerals increased by 100, 200, and 300, respectively. In the method depicted in FIG. 1b, the nanocrystal precursor layer 110 is a mixture of $CuInS_2$ nanoparticles 112 with particles 120 of Cu, In, Ga, S, Se, and their alloys or the combination thereof. In the method of FIG. 1c, the nanocrystal precursor layer 210 is a mixture of $CuInS_2$ nanoparticles 212 with oxide particles 222 of Cu, In, Ga, S and Se or the combination thereof. In the method of FIG. 1d, the nanocrystal precursor layer 310 is a mixture of $CuInS_2$ nanoparticles 312 with chalcogenide particles 324 of Cu, In, and Ga, or the combination thereof, wherein chalcogenide pertains to compounds containing S, Se, and Te.

In FIGS. 1b-d, the $CuInS_2$ nanoparticles 112, 212, 312, when mixed with other sources of particles 120, 222, 324, act as a buffer for the composition control at the nanometer scale for the formation of quality absorber thin films 118, 218, 318. These other sources of particles may include: particles 120 of Cu, In, Ga, Se, S and their alloys, or combinations thereof (FIG. 1b); particles 222 of Cu, In, Ga, Se, and S, or combinations thereof (FIG. 1c), or chalcogenide particles 324 of Cu, In, and Ga, or combinations thereof (FIG. 1d), wherein chalcogenide means compounds of S, Se and Te.

Furthermore, in each of FIGS. 1b-d, the nanoparticles of $CuInS_2$ 112, 212, 312 may be replaced partly or whole with its alloys of Ga and Se, such as $Cu(In,Ga)S_2$ and $Cu(In,Ga)(S, Se)_2$. In the embodiments where $CuInS_2$ nanoparticles 112, 212, 312 are combined with other sources of particles 120, 222, 324, the amount of the other sources of particles 120, 222, 324 are weighted to keep the final Cu:In ratio within the preferred stoichiometry of the final corresponding alloy composition. Furthermore, in these compounds, the stoichiometry of the nanoparticles may be slightly copper rich or poor, indium rich or poor, gallium rich or poor, and chalcogenide rich or poor.

In a further aspect of the present invention, methods of fabricating a nanocrystal precursor layer 10, 110, 210, 310 containing nanoparticles 12, 112, 212, 312 of $CuInS_2$ and/or its related alloys are provided. In one embodiment, fabricating the nanocrystal precursor layer 10, 110, 210, 310 includes coating the substrate 14, 114, 214, 314 with a nanocrystal ink solution containing nanoparticles 12, 112, 212, 312 of $CuInS_2$ and/or its related alloys. The nanocrystal ink solution may be solely comprised of $CuInS_2$ nanoparticles 12 to form the nanocrystal precursor layer 10 of FIG. 1a, for example. Alternatively, the nanocrystal ink solution may be comprised of a mixture of $CuInS_2$ nanoparticles 112, 212, 312 with other particles of the CIGS family of materials, including, for example, the particles 120, oxide particles 222, and metal chalcogenide particles 324, respectively, as described above with respect to FIGS. 1b-d, respectively. Nonetheless, a preferred component of the nanocrystal ink solution is the $CuInS_2$ nanoparticles 12, 112, 212, 312, including both amorphous, crystalline and/or the combination thereof.

The nanocrystal precursor layers 10, 110, 210, 310 may be fabricated using various methods by deposition in single or multiple layers of various thicknesses from an ink solution containing $CuInS_2$ nanoparticles 12, 112, 212, 312. The nanoparticle precursor layers 110, 210, 310 may alternatively be fabricated by deposition of alternating layers of an ink solution containing $CuInS_2$ nanoparticles 112, 212, 312 and an ink solution that does not contain $CuInS_2$ nanoparticles. As provided above, after fabrication of the nanocrystal precursor layers 10, 110, 210, 310 on desired substrates 14, 114, 214, 314, the nanocrystal precursor layers 10, 110, 210, 310 are subsequently selenized in a selenium containing atmosphere at elevated temperatures for the formation of the corresponding CIS absorber thin films 18, 118, 218, 318. The source of the selenium in the selenization step 116, 216, 316 may be from $H_2Se$, Se vapor, Se pellets, organic Se precursors, Se particles mixed with the nanocrystal precursor layer 110, 210, 310, an alternating layer of Se with the nanocrystal precursor layer 110, 210, 310, or a Se containing coating on the nanocrystal precursor layer 110, 210, 310.

In a further aspect of the present invention, the $CuInS_2$ nanocrystal inks may be used in conjunction with another ink solution which may include other sources of particles of the CIGS family of materials, and which may or may not contain $CuInS_2$ nanoparticles. The different ink solutions may be used to coat the substrates 114, 214, 314 in single or multiple layers of various thicknesses, either simultaneously, or in some combination of alternating layers. The other ink solution may include particles of metal, metal oxide, metal selenides of the I-III-VI family of materials or a combination thereof, with or without $CuInS_2$ nanoparticles, including, for example, ink solutions that include particles of Cu, In, Ga, S, Se, and their alloys, or combinations thereof. In another example, the other ink solution may include oxide particles of Cu, In, Ga, S and Se, or combinations thereof. Moreover, the other ink solution may include chalcogenide particles of Cu, In, and Ga, or combinations thereof, wherein chalcogenide pertains to compounds containing S, Se, and Te.

In the various embodiments of the present invention, the $CuInS_2$ nanoparticles, or its mixture, could be suspended in an organic or inorganic solvent with various ligands and surfactants to aid the suspension of the particles. The $CuInS_2$ nanoparticles could be formed using various solid or solution-based synthesis techniques known in the art. For example, the $CuInS_2$ nanoparticles may be synthesized using metal precursors in a compatible solvent. The precursors to be used in such process may include various metal halides, metal salts, organometallic precursors, elemental metals, elemental chalcogen, as well as chalcogen compounds. Examples of compatible solvents are various alkanes, alkenes, and their derivatives such as amines, phosphines, phosphine oxides, thiols, carboxylic acids, and phosphonic acids. The teachings of the present invention should not be limited by the source of the $CuInS_2$ nanoparticles. Rather, it is the application of the $CuInS_2$ nanoparticles that is a key constituent in the fabrication of CIS absorber films.

EXAMPLE

In one example, the $CuInS_2$ nanoparticles were synthesized by injection of sulfur dissolved in oleylamine into a hot oleylamine solution containing CuCl and $InCl_3$ as the sources for the metals. All manipulations were performed using standard air-free techniques utilizing a Schlenk line or glove box. According to the principles of the experimental procedure, about 12 ml of oleylamine, about 1.5 mmol (0.149 g) of CuCl in oleylamine, and about 1.5 mmol (0.331 g) of $InCl_3$ were added to a about 100 ml three-neck round bottom flask connected to a Schlenk line apparatus. The contents in the flask were heated to about 130° C. and purged with argon three times by repeated cycles of vacuuming and back filling with inert gas, and then degassed at about 130° C. for about 30 minutes. Next, the temperature of the reaction mixture was raised to about 225° C., and about 3 ml of 1 molar solution of sulfur dissolved in oleylamine was rapidly injected into the reaction mixture. The temperature was held at about 225° C. for about 30 minutes after injection, and the mixture was allowed to cool to about 60° C. and a non-polar solvent (i.e., toluene, hexane) was added to disperse the particles. A miscible anti-solvent (i.e., ethanol) may be added to flocculate the particles. The particles were then collected by centrifuging at about 10000 RPM for about 10 minutes. The dark precipitate is then redispersed in non-polar solvents such as hexane and toluene to form a stable ink solution. Similarly, nanocrystal ink solutions of alloys of $CuInS_2$ with Ga and Se may be synthesized by replacing, partly or whole, the In and S precursors with Ga or Se precursors.

Figure 2:
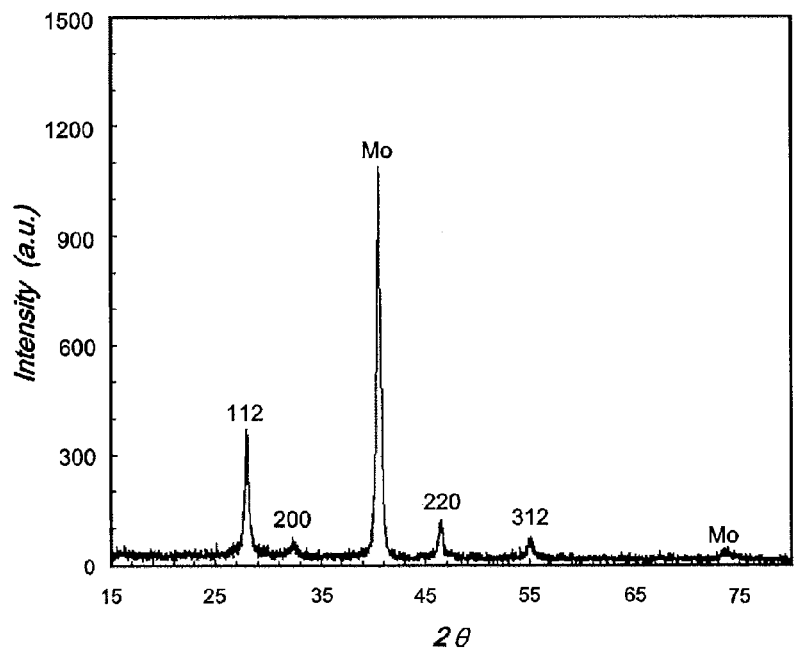
FIG. 2 is a Power X-ray Diffraction (PXRD) graph of as-synthesized CuInS$_2$ nanoparticles on a molybdenum substrate, showing the expected peaks from the CuInS$_2$ nanocrystal structure.

FIG. 2 shows the PXRD pattern of the nanocrystals ink after being drop-casted on a molybdenum coated substrate. The peaks at 28.04, 32.56, 46.6, and 55.28 can be indexed to the (112), (200), (204) and (312) reflections of the $CuInS_2$ crystal structure. The crystalline size of the $CuInS_2$ nanoparticles was calculated, using the Scherrer equation, at about 25 nm. Nanocrystals of different sizes may be obtained by altering the reaction conditions. The $CuInS_2$ nanoparticles typically have an average particle size of from about 1 nm up to about 100 nm or greater, preferably less than about 100 nm and more preferably in the neighborhood of about 15 nm.

The $CuInS_2$ nanocrystals ink formed by re-dispersion of the $CuInS_2$ nanoparticles in a non-polar solvent may be used directly to coat substrates to form a nanocrystal precursor film, either through single or multiple coatings of various thicknesses. Although the $CuInS_2$ forms a stable solution in toluene, addition of other organic or inorganic materials such as surfactants, stabilizers, solvents, leveling agents, and de-oxidation agents may be added to the solution for their respected purposes are within the scope of the present invention and should not be taken as a limit to the present teaching. Once a stable ink solution is formed, various techniques may be used to coat the substrates with the nanocrystal inks, such as spray coating, inkjet printing, web coating and others are within the scope of this embodiment. In this example, drop casting was used to coat the substrates, in which a thin film is obtained by dropping a desired amount of the ink solution directly on the substrate and the solvent is allowed to evaporate.

Figure 3:
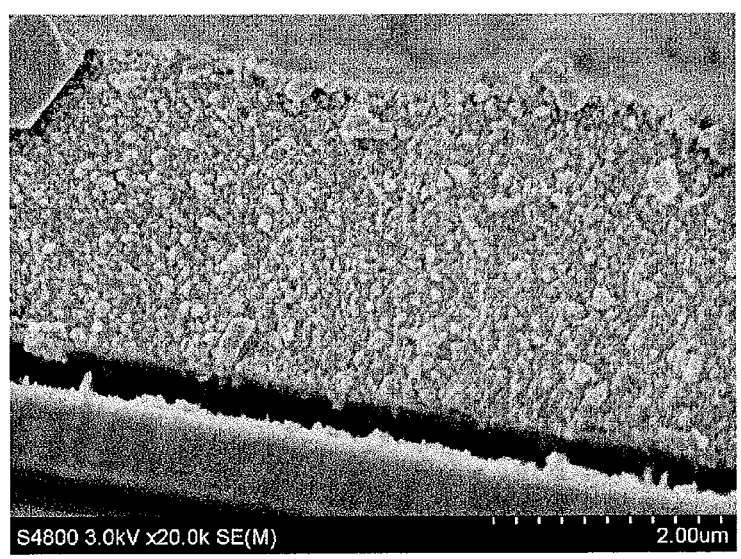
FIG. 3 is a Field Emission Scanning Electron Microscope (FE-SEM) image of a nanocrystal precursor layer containing CuInS$_2$ nanoparticles after casting on a molybdenum substrate.

FIG. 3 shows a FE-SEM image of the $CuInS_2$ nanocrystal precursor layer coated on a molybdenum substrate in accordance with one example of the present invention. It is shown that a layer of $CuInS_2$ nanoparticles in the order of several micrometers may be obtained using the methods disclosed herein. The $CuInS_2$ nanoparticles packed into a very dense layer due to the small size of the $CuInS_2$ nanoparticles. Similarly, nanocrystal ink solutions of alloys of $CuInS_2$ with Ga and Se may be used to replace partly or whole the $CuInS_2$ nanocrystal ink to fabricate the nanocrystal precursor layer.

Figure 4:
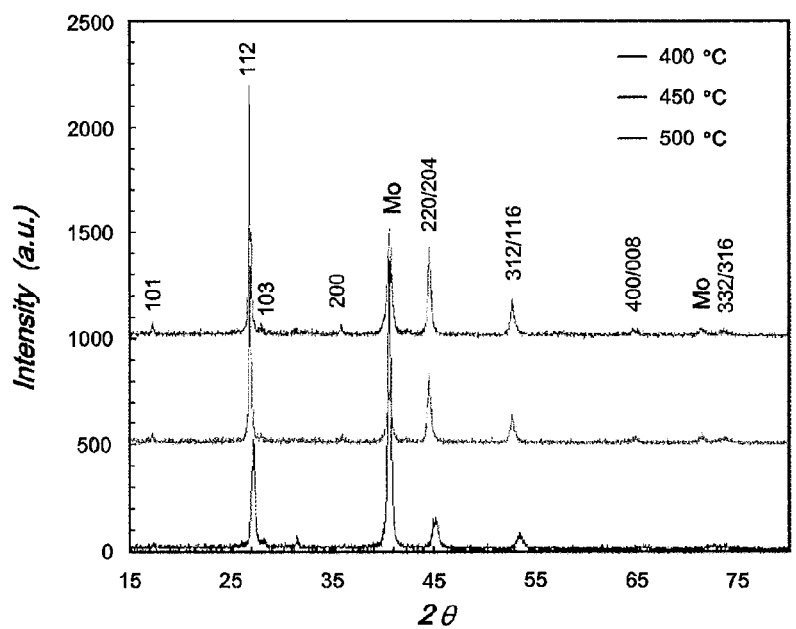
FIG. 4 is a PXRD graph of a CIS absorber film after selenization of the CuInS$_2$ precursor layer with Se vapor at various temperatures, specifically 400° C., 450° C., and 500° C.

FIG. 4 shows the PXRD pattern of a CIS absorbers thin film after selenization of the $CuInS_2$ nanoparticle precursor layer at various temperatures, specifically at about 400° C., 450° C., and 500° C. The peaks are indexed accordingly to the chalcopyrite structure of the $CuIn(S_y,Se_{1-y})_2$. As illustrated, the diffraction peaks shift left systematically as the selenization temperature increases, indicating a larger degree of Se incorporation into the $CuInS_2$ matrix.

Figure 5:
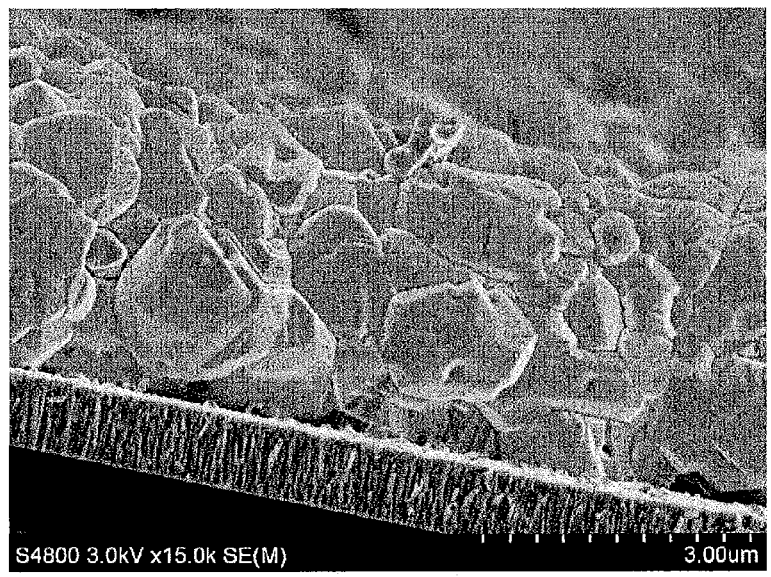
FIG. 5 is a FE-SEM image of a CIS absorber film after selenization of the CuInS$_2$ precursor layer with Se vapor at 500° C. for 30 minutes, showing the large and densely packed grains after selenization.

FIG. 5 shows a FE-SEM cross sectional image of a CIS absorber film after selenization of a $CuInS_2$ nanoparticle precursor film at about 500° C. for about 30 minutes. From the FE-SEM image, it is shown that after selenization the $CuInS_2$ nanocrystals grow into large grains that are on the length-scale of the thickness of the film, a morphological feature of the highest efficiency CIS and CIGS solar cells.

Figure 6:
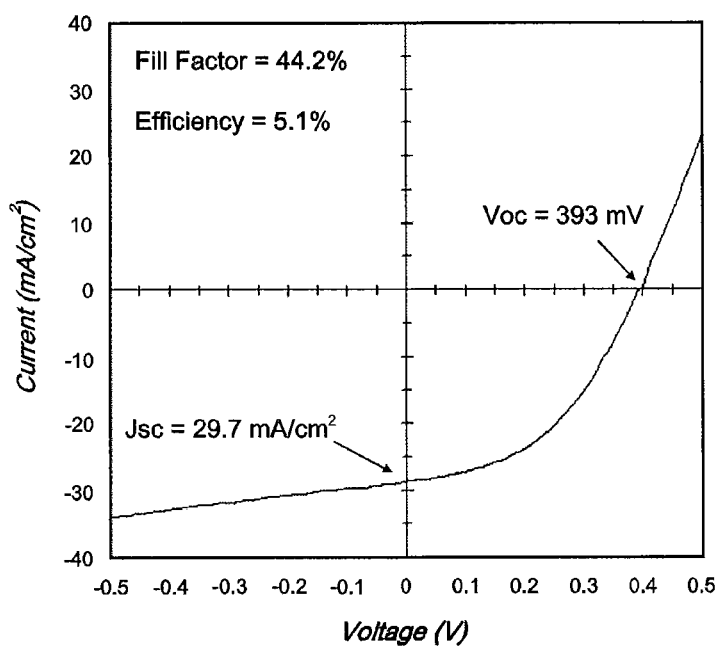
FIG. 6 is a graph depicting the current vs. voltage characteristic of a completed device showing 5.1% light to electricity conversion efficiency under AM1.5 illumination.

The selenized CIS absorber films of the present invention are active absorber layers and can be further fabricated into functional photovoltaic devices. For example, a cadmium sulfide layer by chemical bath deposition can be deposited on top of the CIS absorber film, and followed by sputtering of intrinsic zinc oxide and tin doped indium oxide layers, and top contact grids into completed devices. FIG. 6 shows a current-voltage measurement of one example of a device fabricated using a CIS absorber film selenized at about 450° C. for about 30 minutes. The device tested in FIG. 6 shows a light to electricity conversion efficiency of about 5.1%. The absorber thin films fabricated in accordance with the teachings of the present disclosure are not limited to photovoltaic applications and may be used in other non-solar related electronic devices.

While exemplary embodiments incorporating the principles of the present invention have been disclosed hereinabove, the present invention is not limited to the disclosed embodiment. Instead, this application is intended to cover any variations, uses, or adaptations of the inventions using its general principles. Further, this application is intended to cover such departures from the present disclosure as come within known or customary practice in the art to which this invention pertains and which fall within the limitations of the appended claims.

The invention claimed is:

1. A method of fabricating thin films for photovoltaic or electronic applications comprising:

synthesizing nanoparticles comprising at least one of $CuInS_2$, $CuIn(S_y, Se_{1-y})_2$, $CuGaS_2$, $CuGa(S_y,Se_{1-y})_2$, $Cu(In_xGa_{1-x})_2$, and $Cu(In_xGa_{1-x})(S_y,Se_{1-y})_2$, wherein $0 \leq x \leq 1$ and $0 \leq y \leq 1$;

adding the nanoparticles to a solvent to form a first ink solution;

preparing a second ink solution; and depositing alternating layers of the first ink solution and the second ink solution onto a substrate to form nanocrystal precursor layers, wherein only the first ink solution comprises one of $CuInS_2$, $CuIn(S_y,Se_{1-y})_2$, $CuGaS_2$, $CuGa(S_y,Se_{y-1})_2$, $Cu(In_xGa_{1-x})S_2$, and $Cu(In_xGa_{1-x})(S_y, Se_{1-y})_2$ nanoparticles and combinations thereof, wherein $0 \leq x \leq 1$ and $0 \leq y \leq 1$; and selenizing the nanocrystal precursor layers in a selenium (Se) containing atmosphere.

2. The method according to claim 1, wherein the source of the Se in the Se containing atmosphere includes one of $H_2Se$, Se vapor, Se pellets, organometallic Se precursors, Se particles mixed with the nanocrystal precursor layers, an alternating layer of Se with the nanocrystal precursor layers, and a Se containing coating on the nanocrystal precursor layers.

3. The method according to claim 1, wherein the temperature during selenizing is between about 350° C. and about 600° C.

4. The method according to claim 1, wherein the nanoparticles used to form the nanocrystal precursor layers have an average particle size from about 1 nm to about 100 nm.

* * * * *